METHOD OF FABRICATING A SEMICONDUCTOR BY MASKING

Filed March 23, 1964 2 Sheets-Sheet 1

INVENTORS
JOSEPH H. SCOTT, JR.
& GEORGE W. McIVER
BY W.S. Hill
AGENT

METHOD OF FABRICATING A SEMICONDUCTOR BY MASKING

Filed March 23, 1964 2 Sheets-Sheet 2

INVENTORS
JOSEPH H. SCOTT, JR.
& GEORGE W. McIVER
BY W.S. Hill
AGENT

United States Patent Office 3,298,879
Patented Jan. 17, 1967

3,298,879
METHOD OF FABRICATING A SEMICONDUCTOR BY MASKING

Joseph H. Scott, Jr., Newark, N.J., and George W. McIver, Playa del Rey, Calif., assignors to Radio Corporation of America, a corporation of Delaware
Filed Mar. 23, 1964, Ser. No. 353,957
2 Claims. (Cl. 148—187)

Figures 1A, 1B, 1C, 1D, 1E, 2A, 2B, 2C, 2D, 2E:
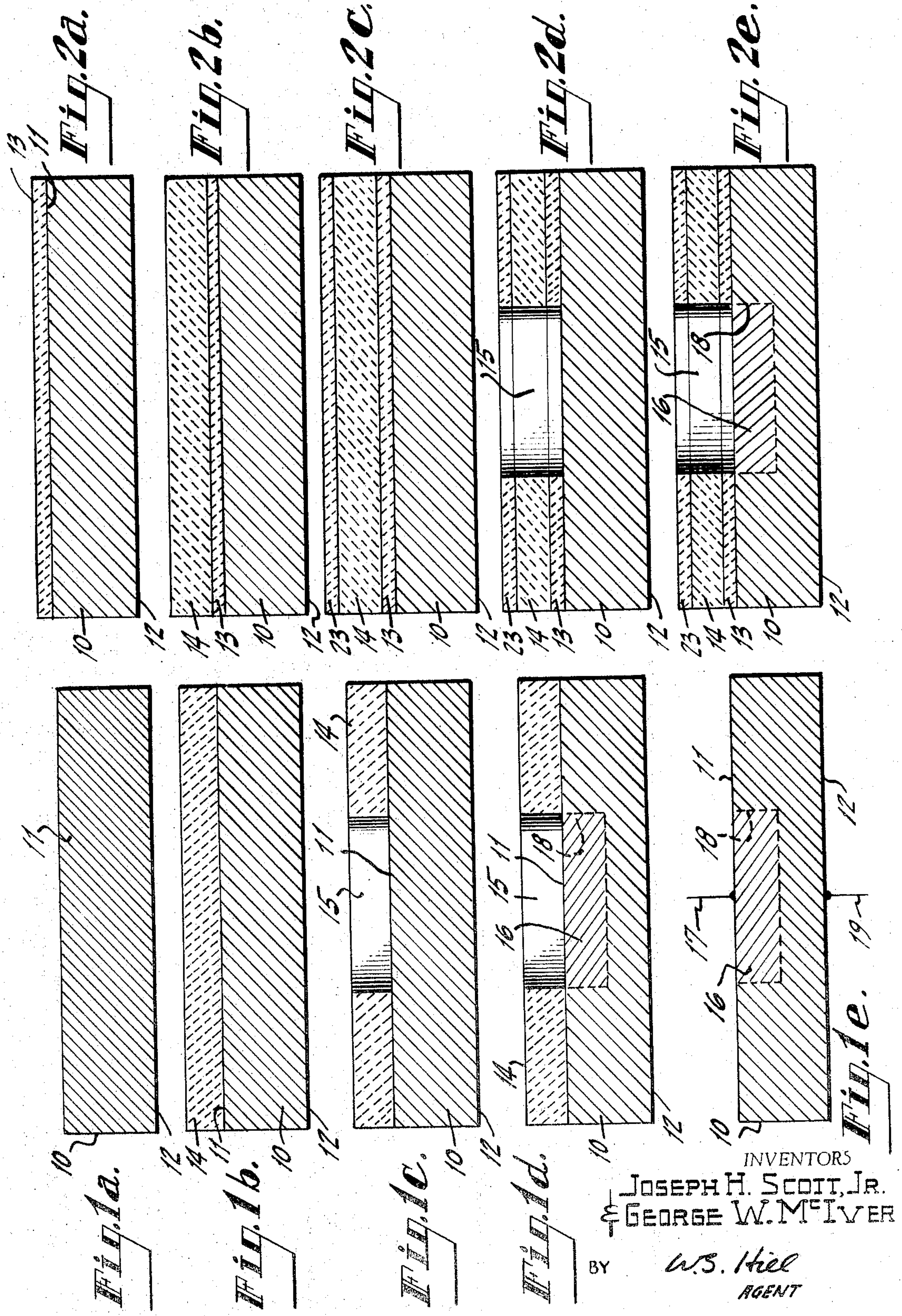

This invention relates to improved methods of fabricating semiconductor devices. More particularly, the invention relates to an improved method of controlling the size and shape of rectifying barriers introduced in bodies of semiconductive materials.

One method of making junction type semiconductor devices includes the step of heating a given conductivity type semiconductive body in an ambient containing a conductivity type-determining substance capable of imparting opposite conductivity type to the particular semiconductor employed. The ambient is usually a vapor, but may be a liquid, or a solid containing a conductivity type modifier. The conductivity type-determining substance, which is also known in the art as an impurity, or a doping agent, or a conductivity type modifier, may be either an acceptor or a donor of charge carriers. The conductivity modifier deposits on the semiconductive body from the ambient and diffuses into the semiconductive body to a depth determined by the temperature and duration of heating, as well as by the diffusion constant of the particular conductivity modifier in the particular semiconductor. A region of the semiconductive body is thereby converted to opposite conductivity type, and a rectifying barrier known as a P–N junction is formed at the interface between the given conductivity type bulk of the wafer and the impurity-diffused opposite conductivity type wafer region. The rectifying barrier thus produced extends beneath the entire surface of the wafer, unless portions of the wafer surface are masked to confine the diffusion to the unmasked portions of the wafer.

It is known to control the size and shape of rectifying barriers formed in a semiconductor wafer by masking portions of the wafer surface prior to the step of diffusing a conductivity modifier into the wafer. The mask generally consists of a layer or coating of an inert material, such as silicon oxide or the like. The conductivity modifier diffuses selectively into the wafer, with diffusion being considerably (several orders of magnitude) faster into those wafer surface regions which are not masked than into those wafer regions underlying surface portions masked with the oxide coating. Thus the concentration of the diffused conductivity modifier in the unmasked portion of the wafer may be made high enough to convert this portion of the wafer to opposite conductivity type, while the concentration of the diffused modifier in the masked portion of the wafer remains so low that its original given conductivity type is unchanged. The impurity-diffused wafer region, and hence the rectifying barrier within the wafer, corresponds approximately in size and shape to the unmasked portions of the wafer surface. These techniques have been successful using silicon oxide masking layers, with a number of conductivity modifiers, for example, with acceptors such as boron, and with donors such as phosphorus and arsenic. However, this method has not hitherto been successful when the conductivity modifier consists of zinc or cadmium, since zinc or cadmium tend to diffuse through an oxide mask very rapidly.

It is therefore an object of this invention to provide an improved method of fabricating semiconductor devices.

Another object of the invention is to provide an improved method of introducing rectifying barriers in semiconductor wafers.

But another object is to provide an improved method of controlling the concentration of a conductivity type-determining substance in a semiconductive body.

Still another object is to provide an improved method of controlling the size and shape of rectifying barriers in semiconductive bodies.

These and other objects of the invention are attained by fabricating semiconductor devices by a process which includes the steps of, first, depositing on a portion of the surface of a semiconductive body a masking layer or coating of an inert material, such as an oxide. Incorporated in the masking layer is another substance which inhibits the diffusion of a particular conductivity modifier through the masking layer. The semiconductive body is then treated in the vapors of the particular conductivity modifier to diffuse the modifier into the unmasked portion only of the semiconductive body.

Figure 3:
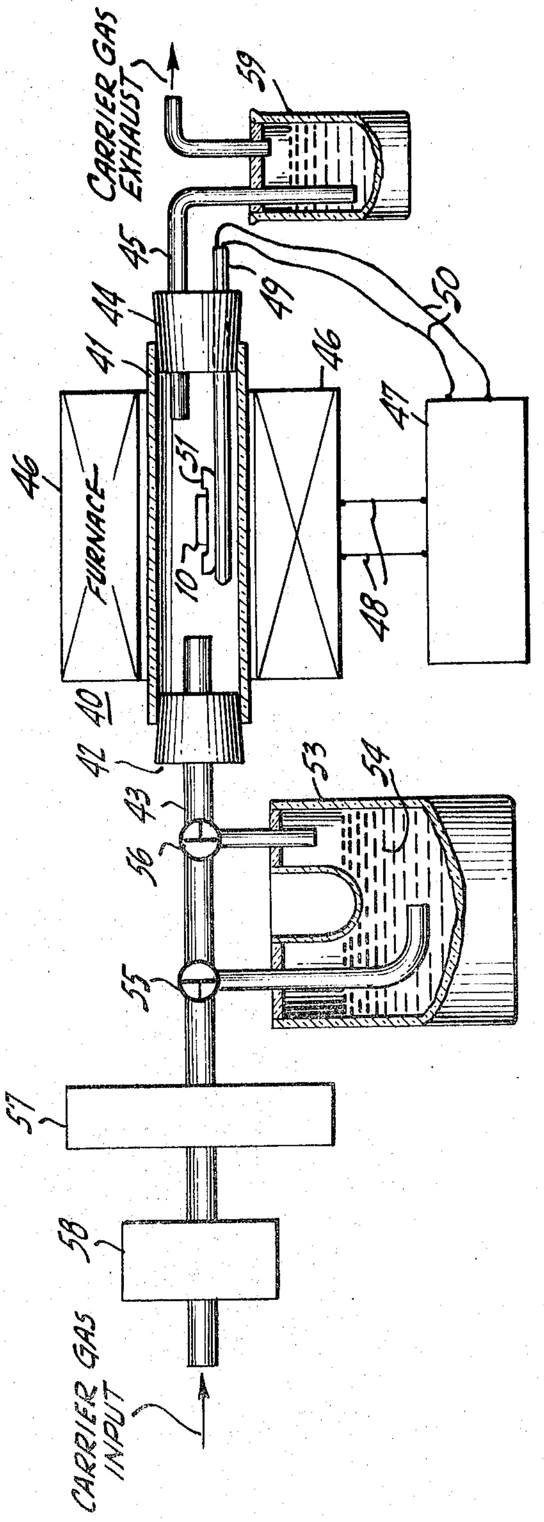

The invention will be described in greater detail by the following examples, considered in connection with the accompanying drawing, in which:

FIGURES 1*a*–1*e* are cross-sectional elevational views illustrating the fabrication of a semiconductor device according to one embodiment;

FIGURES 2*a*–2*e* are cross-sectional elevational views illustrating the fabrication of a semiconductor device according to another embodiment; and, FIGURE 3 is a cross-sectional schematic view of one form of apparatus useful in the practice of the invention.

Similar reference characters are applied to similar elements throughout the drawing.

A diffusion mask for semiconductive bodies preferably consists of a material which is sufficiently inert so as not to react with the semiconductive body, is sufficiently refractory to withstand the elevated temperatures utilized during the diffusion step, and is sufficiently adherent to the semiconductive body to prevent diffusion underneath the edges of the mask. Oxides such as silicon oxide (both silicon monoxide and silicon dioxide), magnesium oxide, titanium oxide, and aluminum oxide may be utilized for this purpose. The masking material may be deposited by vacuum evaporation.

A convenient method of depositing a silicon oxide coating on a semiconductor wafer is to heat the wafer in the vapors of an organic siloxane compound at a temperature below the melting point of the semiconductor but above the temperature at which the siloxane compound decomposes, so that an inert adherent coating believed to consist principally of silicon oxides is formed on the wafer surface. For example, see U.S. Patent 3,089,793, issued to E. L. Jordan and D. J. Donahue on May 14, 1963, and assigned to the assignee of this application.

Another method of depositing a masking coating on a semiconductor is to thermally decompose an organic siloxane compound, and then force the decomposition products of the compound through a jet, so as to impinge upon a semiconductor body, and coat the body with an adherent film believed to consist principally of silicon oxides. For example, see U.S. Patent 3,114,663, issued December 17, 1963, to J. Klerer, and assigned to the assignee of this application.

A method of applying an inert adherent silicon oxide coating to a semiconductive body, and incorporating in the coating a substance which inhibits the diffusion of a conductivity modifier through said coating, together with apparatus useful for this purpose, will now be described.

DESCRIPTION OF APPARATUS

One form of apparatus useful in the practice of the invention is illustrated in FIGURE 3. The apparatus 40 consists of a refractory furnace tube 41, which may, for example consist of a high melting glass, or of fused silica, or the like. Furnace tube 41 has at one end a stopper 42 containing an inlet tube 43, and at the other end a stopper 44 containing an outlet tube 45. Around a central portion of furnace tube 41 is a furnace 46, which may, for example, be an electrical resistance furnace. Advantageously, the temperature of furnace 46 is kept within the desired range by means of a controller 47, which is connected by a pair of electrical lead wires 48 to the furnace 46. Furnace tube 41 contains a temperature-sensing element 49 which is mounted in outlet stopper 44. The temperature-sensing element 49 contains a temperature-sensitive device such as a thermocouple (not shown) which is connected by a pair of electrical lead wires 50 to controller 47. A holder 51 is supported by the temperature-sensing element 49. The semiconductor wafer 10 to be treated is placed on the holder 51. A gas bubbler 53 feeds into the inlet tube 43. The bubbler 53 contains a liquid 54 consisting of an organic siloxane compound in which is dissolved a substance which is the inhibitor that is to be incorporated in the silicon oxide layer, or is the progenitor of the inhibitor. Inlet tube 43 also includes valves 55 and 56 at the entrance and exit respectively of bubbler 53. The bubbler 53 may thus be bypassed when desired by means of valves 55 and 56. A gas dryer 57 and a flow meter 58 for controlling the flow of an inert carrier gas is ahead of bubbler 53 in the gas train. The carrier gas, such as argon or the like, is introduced into the system from a gas source (not shown), which may be a tank or a line. The outlet tube 45 leads to a gas scrubber 59. The carrier gas is passed through the apparatus 40 in the direction indicated by the arrows and leaves scrubber 59 by way of the exhaust. Suitably, the inlet tube 43, the outlet tube 45, the holder 51, and the scrubber 59 are all made of refractory material such as fused quartz.

*Example I*

A crystalline semiconductor body or wafer 10 (FIGURE 1*a*) is prepared with two opposing major faces 11 and 12. The exact size, shape, composition, and conductivity of wafer 10 are not critical. Semiconductive wafer 10 may consist of a III–V compound, that is, a member of the group consisting of the nitrides, phosphides, arsenides, and antimonides of boron, aluminum, gallium and indium. In this example, wafer 10 consists of N-type gallium arsenide. Wafer 10 is etched, cleaned, dried, then positioned in apparatus 40 (FIGURE 3) on holder 51, with one major face 12 down on the holder, and introduced into furnace tube 41. Furnace tube 41 is stoppered and suitably positioned in furnace 46. In this example, the furnace controller 47 is set to maintain the temperature inside furnace tube 41 at about 750° C. Most organic siloxane compounds begin to decompose at about 600° C. in the absence of oxygen. The carrier gas which is passed through apparatus 40 may, for example, be nitrogen, argon, helium, and the like. Hydrogen and hydrogen-nitrogen mixtures known as forming gas may also be utilized as the carrier gas. In this example, the carrier gas consists of nitrogen and the liquid siloxane compound 54 in bubbler 53 consists principally of ethyl orthosilicate. The diffusion inhibitor dissolved in the liquid siloxane compound 54 consists of trimethyl phosphate in this example. The proportions of the inhibitor and of the siloxane compound may be varied to obtain different concentrations of the inhibitor in the silicon oxide mask subsequently formed. In this example, liquid 54 consists of eight volumes ethyl orthosilicate and two volumes trimethyl phosphate.

Line nitrogen is passed through the system at the rate of about two cubic feet per hour while the furnace 46 is warmed to the desired temperature. During this period, the bubbler 53 is bypassed. When the temperature inside furnace tube 41 has reached 750° C., the flow of nitrogen is switched by means of valves 55 and 56 so as to bubble through the siloxane mixture 54. The mixed vapors of ethyl orthosilicate and trimethyl phosphate are swept by the nitrogen through the inlet tube 43 into the furnace tube 41, where they are decomposed. A phosphorus-containing silicon oxide coating 14 (FIGURE 1*b*) is thus deposited on the exposed major face 11 of semiconductive wafer 10. Any oxide coating 14 on the ends of wafer 10 may be removed by subsequently trimming the ends of the wafer. Conveniently, a relatively large slice of semiconductive material may be treated in this manner, or a plurality of such slices, and subsequently diced into wafers or dies of the appropriate size and shape.

The carrier gas and the remaining decomposition products leave the apparatus 40 by way of the exhaust. After about ten to twenty minutes of deposition of the phosphorus-containing silicon oxide layer 14, the flow of the carrier gas is switched back by means of valves 55 and 56 so that the bubbler 53 is again bypassed, and the furnace 46 is shut off. When the temperature inside the furnace tube 41 has dropped to about 200° C., the flow of the carrier gas may be turned off completely, and the wafer 10 removed from the furnace tube 41.

A selected portion of masking layer 14 is now removed by any convenient technique. The most simple and direct method is to utilize grinding wheels or lapping tools to remove the undesired portion of masking layer 14. Alternatively, a portion of masking layer 14 is covered with an acid resist (not shown), such as paraffin wax or apiezon wax. Other acid resists, including photoresists such as bichromated proteins, or commercially available photoresists, may be utilized for this purpose. The wafer 10 is then treated with a suitable etchant, such as a hydrofluoric acid-ammonium floride solution, to remove the exposed portions of masking layer 14. The acid resist is then removed by means of a suitable solvent, leaving wafer 10 as shown in FIGURE 1*c*, with an aperture 15 in the masking layer 14. A selected portion of wafer face 11 is thus exposed.

A diffusion step is now performed by heating wafer 10 in the vapors of zinc. The exact time and temperature utilized depends on the depth at which diffusion is desired. Suitably, the gallium arsenide wafer 10 is heated in zinc vapors at a temperature of about 700° C. to about 900° C. for about one to three hours. Zinc is thus diffused into a wafer portion 16 (FIGURE 1*d*) which is immediately adjacent the unmasked portion of wafer face 11, and corresponds in size and shape to the aperture 15 in masking layer 14. A little zinc also diffuses through the remaining portions of masking layer 14 into face 11 of wafer 10, but owing to the presence of the diffusion inhibitor, which consists of phosphorous atoms in this example, the amount of such diffusion is so small as to be negligible. The zinc-diffused wafer portion 16 is converted to P-type conductivity, and a rectifying barrier or P–N junction 18 is formed at the interface between the P-type zinc-diffused wafer region 16 and the N-type bulk of wafer 10.

The remaining portion of masking layer 14 may be removed by any convenient techniques such as by lapping, or by treating the wafer in a hydrofluoric acid solution. An electrical lead wire 17 (FIGURE 1*e*) is bonded to the zinc-diffused P-type region 16 of wafer 10, and another electrical lead wire 19 is bonded to wafer face 12 coaxially opposite the first lead 17. The device thus fabricated is a diffused gallium arsenide diode.

While the exact mechanism which inhibits the diffusing of zinc through the masking layer 14 is not presently certain, it is theorized that the zinc atoms diffusing through the masking layer 14 react with the diffusion inhibitor (phosphorus atoms in this example) to form a compound (probably zinc phosphide in this example), and are thus immobilized and bound to the masking layer 14. However, it will be understood that the practice of the invention is not dependent on whatever theory is selected to explain the improved results obtained.

In this example, the completed device is a rectifying diode. It will be understood that special purpose diodes, such as tunnel diodes, variable capacitance diodes and light-emitting diodes, may be similarly fabricated.

*Example II*

In some instances, it is found that the masking layer containing the diffusion inhibitor is not as adherent to the semiconductor body as desired. In such cases, the method of the invention may be modified as next described.

A crystalline semiconductive body or wafer 10 (FIGURE 2*a*) is prepared with two opposing major faces 11 and 12. In this example, wafer 10 consists of monocrystalline N-type indium phosphide. A thin layer 13 of pure silicon oxide is deposited on the surface of wafer 10 by any convenient method, such as vacuum evaporation or one of the techniques described in the aforementioned patents. Layer 13 is suitably about 200 to 500 Angstroms thick. While layer 13 is not effective as a diffusion mask against conductivity modifiers such as zinc or cadmium it adheres firmly to the surface of wafer 10 and thus serves as a foundation for a masking layer subsequently deposited. Layer 13 also serves to reduce the diffusion of the inhibitor into the wafer.

Wafer 10 is now positioned in apparatus 40 (FIGURE 3) on holder 51 and treated as described above to deposit over the thin layer 13 of pure silicon oxide a layer 14 of silicon oxide containing a diffusion inhibitor (phosphorus) dispersed therein.

A second film 23 (FIGURE 2*c*) of pure silicon oxide is deposited over the surface of masking layer 14. Film 23 is about 200 to 500 Angstroms thick, and serves to prevent out-diffusion of the inhibitor, and also to provide an adherent surface for commercial photoresists.

Referring now to FIGURE 2*d*, the surface of silicon oxide film 23 is masked with an acid resist (a commercial photoresist, not shown) as described above, and the unmasked portion of silicon oxide layers 13, 14 and 23 are removed. The wafer 10 is now treated in an ambient containing the vapors of a conductivity modifier such as cadmium. The acceptor diffuses into the unmasked portions only of wafer 10 and converts to P conductivity type a wafer region 16 corresponding to the unmasked portions of the wafer. A rectifying barrier 18 is formed at the interface between the P-type diffused region 16 and the N-type bulk of the wafer. The subsequent steps of removing the remaining portions of the acid resist, and of silicon oxide layers 13, 14 and 23, and attaching electrical lead wires to the P-type and N-type regions of the wafer, are similar to those described above in connection with FIGURE 1*e*.

In the above examples, which are by way of illustration only and not limitation, the device described was a diode containing a single rectifying barrier or P–N junction. The method of the invention may also be utilized to fabricate multiple junction devices such as triode transistors and tetrodes. Other semiconductive materials may be utilized for device fabrication. A silicon oxide masking layer incorporating a diffusion inhibitor may be deposited by means of apparatus similar to that described in Klerer U.S. Patent 3,114,663 mentioned above. Various other modifications may be made without departing from the spirit and scope of the invention as described in the specification and appended claims.

What is claimed is:

1. The method of fabricating a semiconductor device, comprising the steps of:

masking a portion of a crystalline semiconductive body consisting of a material selected from the group consisting of the nitrides, phosphides, arsenides and antimonides of boron, aluminum, gallium, and indium with a layer of silicon oxide, said silicon oxide layer including phosphorus dispersed therein; and, heating said body in the vapors of zinc to diffuse zinc into the unmasked portion only of said body.

2. The method of fabricating a semiconductor device, comprising the steps of:

masking a portion of a gallium arsenide body with a layer of silicon oxide, said silicon oxide layer including phosphorus dispersed therein; and, heating said body in the vapors of zinc to diffuse zinc into the unmasked portion only of said body.

References Cited by the Examiner

UNITED STATES PATENTS

| | | | |
|---|---|---|---|
| 2,974,073 | 3/1961 | Armstrong | 148—188 |
| 3,064,167 | 11/1962 | Hoerni | 148—187 X |
| 3,114,663 | 12/1963 | Klerer. | |
| 3,183,129 | 5/1965 | Tripp | 148—187 X |
| 3,200,019 | 8/1965 | Scott et al. | 148—188 |
| 3,203,840 | 8/1965 | Harris | 148—187 |

HYLAND BIZOT, *Primary Examiner.*